(12) United States Patent
Shyu et al.

(10) Patent No.: US 6,775,193 B1
(45) Date of Patent: Aug. 10, 2004

(54) SYSTEM AND METHOD FOR TESTING MULTIPLE EMBEDDED MEMORIES

(75) Inventors: Taiching Shyu, Cupertino, CA (US); Lee-Lean Shu, Los Altos, CA (US)

(73) Assignee: GIGA Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/405,265

(22) Filed: Apr. 1, 2003

(51) Int. Cl.⁷ .............................................. G11C 7/00
(52) U.S. Cl. .................... 365/201; 365/189.02
(58) Field of Search .......................... 365/201, 189.02, 365/230.02, 230.03

(56) References Cited

U.S. PATENT DOCUMENTS

| | | | |
|---|---|---|---|
| 5,495,447 A | | 2/1996 | Butler et al. |
| 5,675,545 A | * | 10/1997 | Madhavan et al. ......... 365/201 |
| 5,680,544 A | | 10/1997 | Edmondson et al. |
| 5,841,784 A | | 11/1998 | Chan et al. |
| 6,067,262 A | | 5/2000 | Irrinki et al. |
| 6,275,428 B1 | | 8/2001 | Fukuda et al. |
| 6,286,115 B1 | | 9/2001 | Stubbs |
| 6,367,042 B1 | | 4/2002 | Phan et al. |
| 6,421,286 B1 | | 7/2002 | Ohtani et al. |
| 6,442,717 B1 | | 8/2002 | Kim |
| 6,449,197 B1 | | 9/2002 | Hiraki et al. |
| 6,486,702 B1 | * | 11/2002 | Ngai et al. ..................... 326/40 |
| 6,510,530 B1 | * | 1/2003 | Wu et al. ....................... 714/30 |

* cited by examiner

Primary Examiner—Vu A. Le
(74) Attorney, Agent, or Firm—Gray Cary Ware & Freidenrich LLP

(57) ABSTRACT

The present invention provides a system and method for testing embedded memories. The present invention logically combines many different embedded memories into one or more large, virtual memory blocks in order to test multiple memories together. The invention defines the X and/or Y address space in all memories in order to cover all memories combined. Compare circuits associated with each memory module are used to compare the data output from each memory cell to an expected value (e.g., to a value that would be expected if the memory cell was operating properly). The invention further uses mask logic to "mask out" any unimplemented address space in each individual memory. The mask logic will always indicate that the comparison or memory test passed when unimplemented addresses are selected. The results of the comparison may be bundled and multiplexed to a test input/output port.

18 Claims, 3 Drawing Sheets

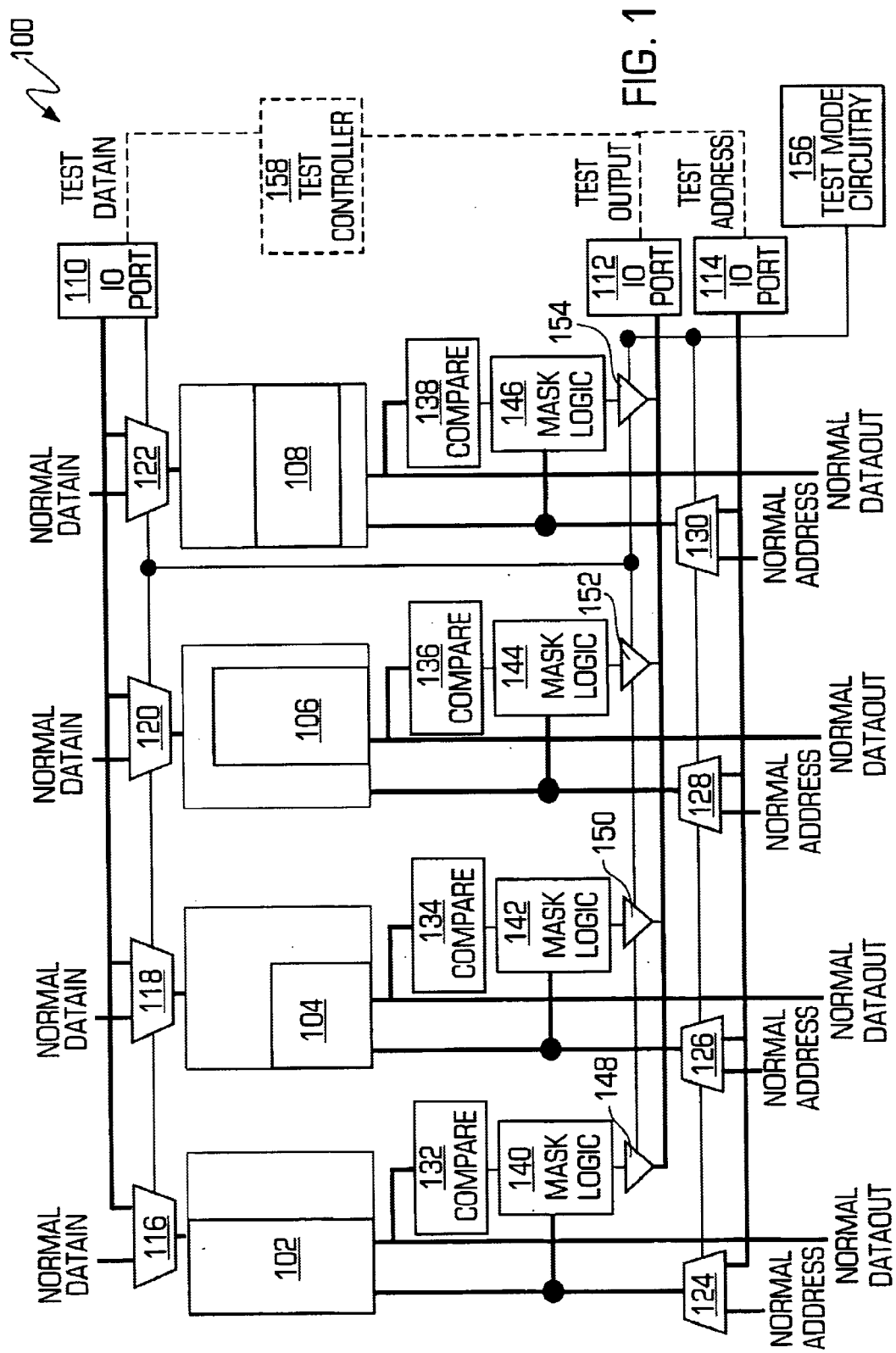

SYSTEM AND METHOD FOR TESTING MULTIPLE EMBEDDED MEMORIES

FIELD OF THE INVENTION

The present invention generally relates to the testing of semiconductor memory devices, such as static random access memory ("SRAM") devices. More particularly, the present invention relates to a system and method for testing multiple embedded memories within an integrated circuit.

BACKGROUND OF THE INVENTION

Testing of semiconductor memory devices is an important step in semiconductor fabrication processes. Integrated circuits and the chips housing these circuits may include multiple embedded memory devices or modules. Each memory cell within an embedded memory must be tested to determine whether it is functioning properly. That is, each memory cell must be tested to ensure that data can properly be written to and read from the memory cell. If even one memory cell in a memory device is defective, the memory device and integrated circuit may not function properly.

Semiconductor fabrication processes typically employ external testing circuits, which may be coupled to an integrated circuit by probing a chip pad. Once attached, a testing circuit will run a program to test a memory device on the circuit. For example, the testing circuit and program may operate to write a series of binary values (e.g., low or "0" values and high or "1" values) to the cells of the memory device, read the values stored in the cells, and compare the values to the correct or expected values to ensure proper operation of each memory cell. The programs employed by the testing circuits are tailored to the specific size, density and configuration of the memory device being tested. For instance, the program will typically correspond to the number of cells in each row and column of the memory device. Therefore, different programs are required to test different types of memory devices. As a result, each time a memory device having a different density or configuration is tested, the testing circuit is disconnected from the integrated circuit to load a new testing program. Once the new testing program is loaded, the testing circuit is reconnected by probing the integrated circuit, and the new memory device may then tested. Because of the increasing density and complexity of today's integrated circuits, the above-described, conventional system and method for testing memories suffers from several significant drawbacks.

Due to developments in semiconductor processing, integrated circuits have increased in size and complexity, and the number and types of memory modules that may be formed on a chip has grown substantially. Integrated circuits have been developed that include over 50 different embedded memory modules. Since the memory modules often differ in density and configuration, many different programs must be run in order to test each memory module. This creates several problems. For example, reloading different testing programs is performed at the end of a batch and is very time consuming. Having to load many different programs significantly increases the overall processing time and decreases efficiency. Furthermore, repeatedly probing the chip pads damages the wafers. The number over times each wafer can be probed without causing unacceptable damage is limited. Thus, probing wafers many times to run different testing programs may result in a significantly reduced yield.

There is therefore a need for an improved system and method for testing embedded memories, which overcomes the foregoing drawbacks of prior memory systems and which allows for testing of integrated circuits having many different memory modules of varying density and configuration.

SUMMARY OF THE INVENTION

The present invention provides a system and method for testing embedded memories. In one embodiment, the present invention logically combines many different embedded memories into one or more large, virtual memory blocks in order to test multiple memories together. The invention expands and/or defines the X and/or Y address space in all memories in order to cover all memories combined. Compare circuits associated with each memory module are used to compare the data output from each memory cell to an expected value (e.g., to a value that would be expected if the memory cell was operating properly). The invention further uses mask logic to "mask out" any unimplemented address space in each individual memory. The mask logic will always indicate that the comparison or memory test passed when unimplemented addresses are selected. The results of the comparison may be bundled and multiplexed to a test input/output port.

One advantage of the present invention is that it utilizes addressing to allow multiple embedded memories to be tested as a virtual memory block, independent of the actual physical location or configuration of the memories.

Another advantage of the present invention is that it allows multiple embedded memories to be tested on a chip without having to repeatedly probe the chip, thereby preventing damage to the chip and increasing overall yield.

Another advantage of the present invention is that allows multiple memories to be tested on a chip without having to load many different programs, thereby significantly reducing processing time and increasing efficiency.

According to a first aspect of the present invention, a system for testing a plurality of embedded memory modules on a chip is provided. The system includes a plurality of embedded memories that are grouped into one or more virtual memory blocks, each of the embedded memories including a plurality of memory cells, which are each assigned an associated address within the one or more virtual memory blocks; a test controller that is adapted to be coupled to the plurality of embedded memories, to communicate test data to the memory cells that are associated with assigned addresses, and to read data from the memory cells; and at least one compare circuit for comparing the data read from the memory cells to expected data, in order to determine if each of the memory cells is operating properly.

According to a second aspect of the present invention, a method is provided for testing a plurality of memory modules embedded on a chip. The method includes the steps of: defining an address space of the chip to cover the plurality of memory modules combined; and testing the plurality of memory modules as a single virtual memory block.

According to a third aspect of the present invention, a method of testing a plurality of embedded memories on a chip is provided. The method includes the steps of: arranging the plurality of embedded memories into one or more virtual memory blocks; assigning addresses to cells of the embedded memories corresponding to the location of the embedded memories within the one or more virtual memory blocks; and testing each of addresses of the one or more virtual memory blocks in a predetermined sequence, effective to test each of the corresponding cells of the embedded memories.

These and other features, advantages, and objects of the invention will become apparent by reference to the following specification and by reference to the following drawings.

BRIEF DESCRIPTION OF THE DRAWINGS

FIG. 1 is a schematic diagram of a system for testing a plurality of embedded memories, according to the present invention.

DETAILED DESCRIPTION OF THE PREFERRED EMBODIMENT OF THE INVENTION

Figures 2, 3A:
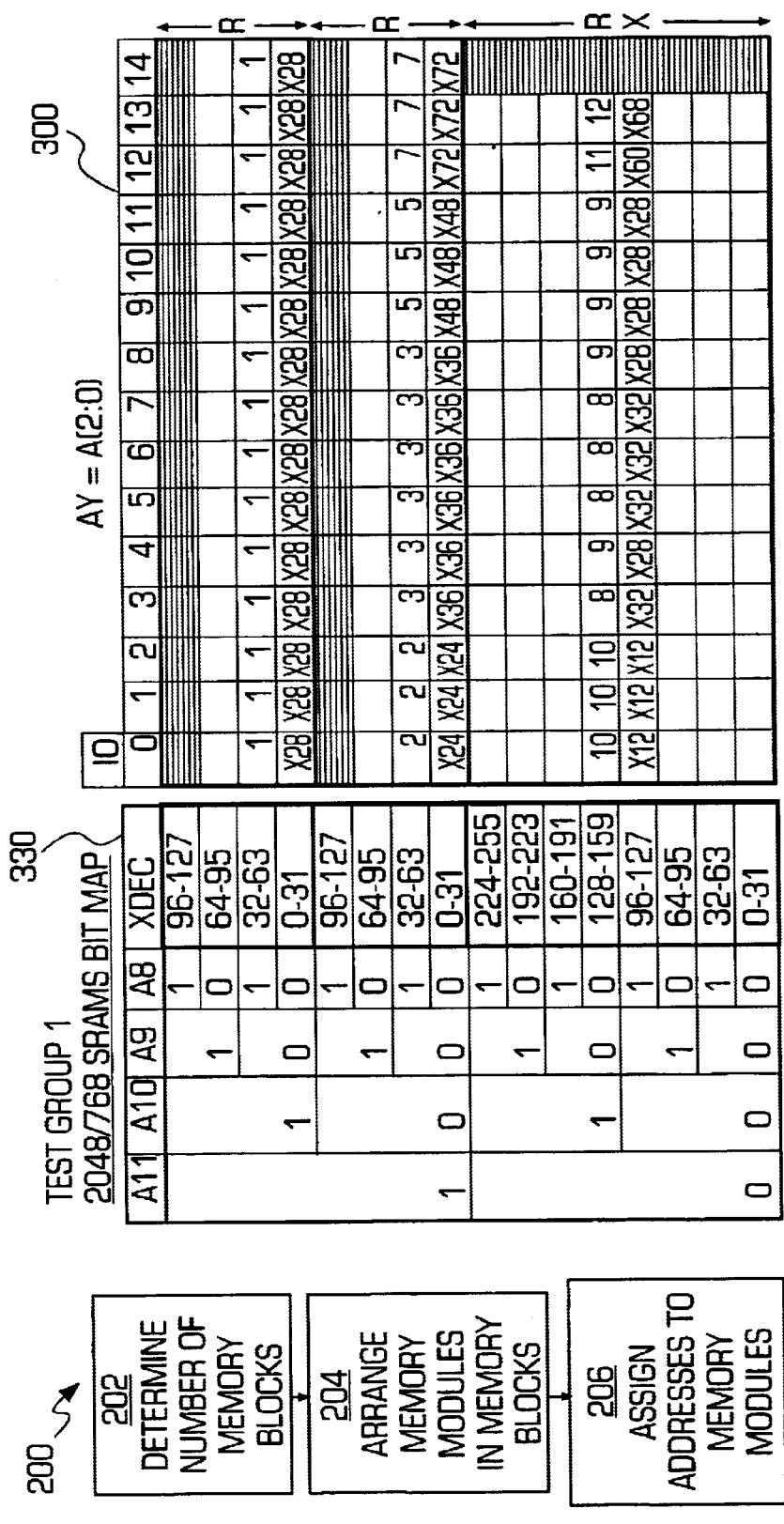
FIG. 2 is a flow diagram illustrating a general method for arranging multiple memory modules into larger memory blocks for testing, according to the present invention.
FIGS. 3A–C are tables illustrating examples of memory module test groups, according to the present invention.

The present invention will now be described in detail with reference to the drawings, which are provided as illustrative examples of the invention so as to enable those skilled in the art to practice the invention. Notably, the implementation of certain elements of the present invention may be accomplished using software, hardware, firmware or any combination thereof, as would be apparent to those of ordinary skill in the art, and the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention.

FIG. 1 illustrates a memory testing system 100 that is made in accordance with a preferred embodiment of the present invention and that is adapted to test a plurality of embedded memories or memory modules 102, 104, 106 and 108 having different densities and configurations. It should be appreciated by one of ordinary skill in the art that system 100 may be integrally formed within a computer chip or integrated circuit that houses memories 102–108. For purposes of illustration and clarity, only four embedded memory modules are shown in FIG. 1. It should be noted, however, that the present system and method may be used to test any number of memory modules.

In the preferred embodiment, system 100 may include the following circuit components: input/output ports 110, 112 and 114; multiplexers 116, 118, 120, 122, 124, 126, 128 and 130; compare circuits 132, 134, 136 and 138; mask logic 140, 142, 144 and 146; tri-state drivers 148, 150, 152 and 154; and test mode circuitry 156. The input/output ports 110–114 may be selectively and communicatively coupled to an external test controller 158, which is adapted to run one or more test programs in order to test modules 102–108 as described below.

Input/output ports 110 are adapted to receive test input data (Test DataIn) and are communicatively coupled to multiplexers 116–122. Multiplexers 116–122 also receive input data during normal operation (Normal DataIn) The outputs of multiplexers 116, 118, 120 and 122 are respectively coupled to memory modules 102, 104, 106 and 108. Multiplexers 116–122 receive control signals from test mode circuitry 156. Based on the control signals received from test mode circuitry 156, multiplexers 116–122 either transmit normal input data or test input data to the memory modules. Particularly, test mode circuitry 156 causes multiplexers 116–122 to communicate test input data to memory modules 102–108 during test mode, and causes multiplexers 116–122 to communicate normal input data to memory modules 102–108 during normal operation.

Input/output ports 114 are adapted to receive test addresses (Test Addresses) corresponding to the test data and are communicatively coupled to multiplexers 124–130. Multiplexers 124–130 also receive addresses corresponding to data for normal operation (Normal Address) of the integrated circuit. The outputs of multiplexers 124, 126, 128 and 130 are respectively coupled to memory modules 102, 104, 106 and 108. Multiplexers 124–130 receive control signals from test mode circuitry 156. Based on the control signals received from test mode circuitry 156, multiplexers 116–122 either transmit normal addresses or test addresses to the memory modules. Particularly, test mode circuitry 156 causes multiplexers 124–130 to communicate test addresses to memory modules 102–108 corresponding to the data being written to or read from modules 102–108 during test mode, and causes multiplexers 124–130 to communicate normal addresses corresponding to the data being written to or read from memory modules 102–108 during normal operation.

During test mode, compare circuits 132, 134, 136 and 138 receive data from modules 102, 104, 106 and 108, respectively. Compare circuits 132–138 compare the received data to values that would be expected or correct if the modules 102–108 were operating properly. Mask logic circuits 140, 142, 144, and 146 are respectively coupled to compare circuits 132, 134, 136 and 138. As discussed more fully and completely below, mask logic circuits 132–138 are adapted to "mask out" any unimplemented address space in the individual memory modules 102–108. Particularly, the mask logic will always indicate that the comparison or memory test passed when unimplemented addresses are selected. It should be appreciated that while four compare and mask logic circuits are shown in FIG. 1, other different numbers of such circuits may be used in other embodiments. In one embodiment, a single compare and mask logic circuit may be used to compare and mask values from the memory modules.

The output of mask logic circuits 140, 142, 144 and 146 are respectively coupled to tri-state drivers 148, 150, 152 and 154. Tri-state drivers 148–154 are communicatively coupled to test mode circuitry 156, which controls the states of the drivers. Particularly, test mode circuitry 156 communicates control signals to the drivers 148–154 to selectively couple and decouple mask logic 140–146 to and from the input/output port 112. By selectively decoupling the mask logic 140–146 from the input/output port 116, the port 112 may be used for other purposes during normal operation of the chip. In alternate embodiments, port 112 may be a dedicated test port, thereby eliminating the need for drivers 148–154.

Figure 3B:
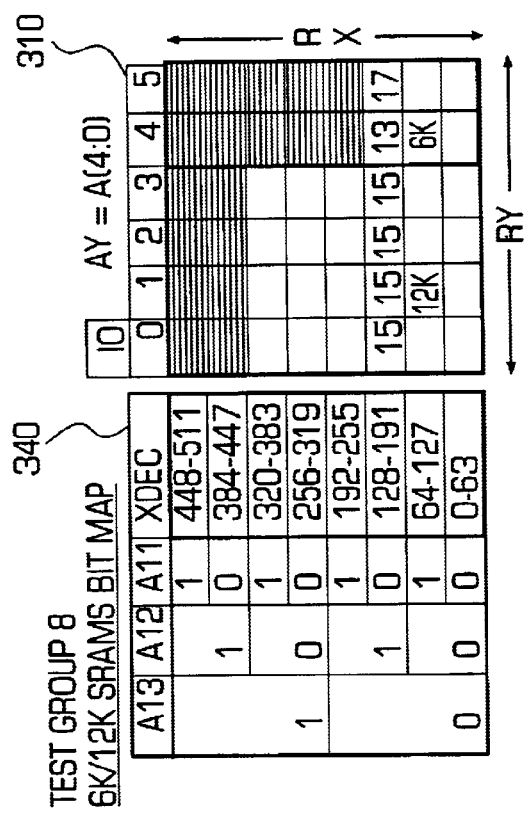
Figure 3C:
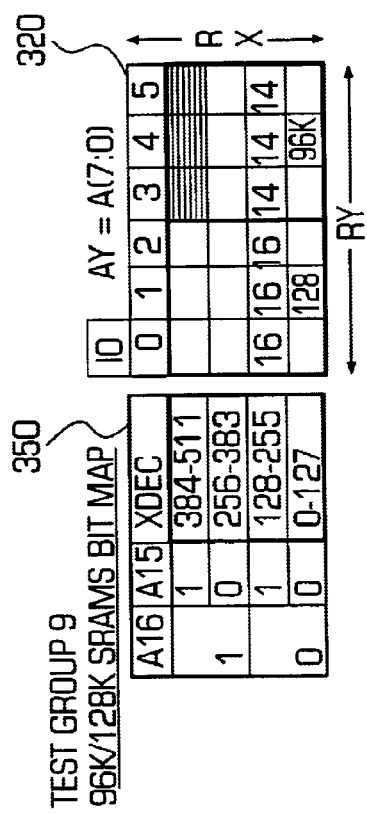

In order for the various memory modules to be tested in an efficient manner, the present invention employs a method by which the memory modules are conceptually grouped into one or more large, "virtual" memory blocks. In this manner, only one program is required to test multiple memories in each memory block. FIG. 2 illustrates an exemplary method 200 that may be used to group multiple memory modules into one or more virtual memory blocks for testing. In step 202, the number of virtual memory blocks for a particular chip is determined. This number may be selected based on the number of memory modules and/or number and/or types (e.g., densities and configurations) of memory modules on a chip. In the preferred embodiment, memory modules having relatively similar densities and configurations are grouped together. For example, memory modules having a similar size or density are placed in the same virtual memory group, in order to minimize the final virtual memory size, which is directly related to the test time. Also, similar types of memories may be grouped together so that the same test program can be used. FIGS. 3A–C illustrate one example of how memory modules having different densities (e.g., 768, 2048, 6 k, 12 k, 96 k and 128 k SRAMs) and I/O data bus widths (e.g., 12, 24, 28, 32, 36, 48, 60, 68 and 72) may be grouped into three separate groups. As shown in FIGS. 3A–C, relatively small memory modules (e.g., 2048 and 768 SRAMs) are assigned to a first test group or memory block; medium-density memory modules (e.g., 6K and 12K SRAMs) are assigned to a second test group; and relatively high density modules (e.g., 96K and 128K SRAMs) are assigned to a third test group.

In step 204, the memory modules are arranged within their respective test groups or virtual memory blocks. In the preferred embodiment, this step involves conceptually arranging the memory modules to form a generally rectangular block. The memory modules may also preferably be arranged in a manner to reduce the amount of unimplemented address space. Also, memory modules of the same type or having similar bus widths may be arranged in close proximity. In alternate embodiments, other attributes of the memories may be used to group and arrange the memories. The example of FIGS. 3A–C illustrates all 768 SRAMs of a first type (e.g., SRAMs having an I/O data bus width of 28) arranged in a conceptually adjacent manner in the first row of the first test group. Other types of 768. SRAMs are arranged in the second row of the test group (e.g., SRAMs having I/O data bus widths of 24, 36, 48 and 72); and the 2048 SRAMs are arranged in the third row of the first test group shown in FIG. 3A. The 6 k and 12 k SRAMs are arranged adjacently in the second test group shown in FIG. 3B, and the 128K and 96 k SRAMs are arranged adjacently in the third test group shown in FIG. 3C. It should be appreciated that the memory modules may include redundant rows and columns, indicated by characters RX and RY, respectively, which may be used to repair defective memories in a conventional manner to increase overall yield.

In step 206, addresses are assigned to the memory modules, which correspond to the locations of the memory modules within the conceptual or virtual arrangements or test groups. The "virtual" addresses are related to real or physical addresses in the memory modules by way of an associative mapping. FIGS. 3A–C illustrate examples of how addresses may be assigned. Particularly, tables 330, 340 and 350 show the addresses assigned to the memory modules shown in tables 300, 310 and 320, respectively. In the first test group shown in tables 300 and 330, Y addresses may be provided by A0, A1 and A2, and X addresses may be provided by A8–A11. In the second test group, shown in tables 310 and 340, Y addresses may be provided by A0–A4, and X addresses may be provided by A11–A13. In the third test group, shown in tables 320 and 350, Y addresses may be provided by A0–A7 and X addresses may be provided by A15–A16. It should be appreciated that by addressing the embedded memories in this manner, the present method is effective to create one or more virtual memory blocks, which allow multiple embedded memories to be tested as a single memory block, even though the memories may be physically disposed remote from one another and in any relative arrangement or configuration.

Next, in step 208, any unimplemented portions or address space (e.g., addresses) within the memory blocks are masked. For example, the regions shown in cross-hatching in FIGS. 1 and 3A–C represent unused address space that would be masked. In the preferred embodiment, the mask logic circuits 140–146 are used to mask these unused portions of memory space during testing. That is, the mask logic circuits 140–146 are programmed to return a "pass" result whenever an unimplemented address is tested in the memory modules 102–104.

In operation, system 100 allows the embedded memory modules to be tested in a quick and efficient manner, without having to probe the chip each time a new memory module is tested. An external test controller 158 may be connected to system 100, as shown FIG. 1, by probing a chip pad (not shown) in a conventional manner. Due to the arrangement of the embedded memory modules into virtual memory blocks, the memory modules (e.g., memory modules 102–108) may be tested at the same time by use of the same testing program. That is, the testing program implemented by controller 158 will progress through the various memory cells contained in the modules by testing the addresses of the virtual memory blocks in a predetermined sequence (e.g., row by row or column by column). For each address in the virtual memory block, a memory cell having an associated physical address is tested in one of the memory modules. The test controller 158 may include a virtual to physical address mapping translator for providing a physical address output to port 114 responsive to a virtual address generated by the test program. Alternatively, a mapping translator may be included on the chip to be tested and/or form a portion of the system 100.

The test controller 158 and program may operate to write a series of binary values (e.g., "0" values and "1" values) to the cells of the memory modules (which correspond to the addresses of the virtual memory block), read the values stored in the cells, and compare the values to the correct or expected values to ensure proper operation of each memory cell. In the example shown in FIG. 1, the values are communicated to the memory modules 102–108 by way of port 110 and multiplexers 116–122. The values are written to the addresses generated by test controller 158, which are communicated to modules 102–108 by way of port 114 and multiplexers 124–130. The values stored in the memory cells are read out of the memory modules and compared to correct or expected values (e.g., values expected if the memory modules were operating properly). In one embodiment, the compare circuits 132–138 compare the output to other outputs that contain the same value. In another embodiment, the expected values are pre-loaded into the compare logic. Additionally, other more complicated methods, such as signature analysis, may be employed to perform this comparison. If the read value matches the expected value, the compare circuit will output a "pass" signal or bit to the test output port 112, and if the read does not match the expected value, the compare circuit will output a "fail" signal or bit to the test output port 112, thereby notifying the test controller 158 of the defective cell. The mask logic 140–146 is used to mask unimplemented addresses in each memory module, illustrated by the cross-hatched areas in FIG. 1. Specifically, the mask logic 140–146 returns a positive result or a "pass" to the test output port anytime an unimplemented address is selected. The results of the testing are communicated to test controller 158 by way of port 112. The test controller 158 may use the results to determine which cells of memory modules 102–108 may be defective and to take appropriate corrective measures, by way of a known corrective procedure or method (e.g., by implementing redundant columns and rows).

In this manner, the system 100 allows a plurality of memory modules to be tested as one virtual memory block. Thus, the present system and method allows groups of embedded memories on a chip or integrated circuit to be tested without having to reload test programs and repeatedly probe the chip pad, thereby significantly reducing the time required to test the chip, preventing damage to the chip, and increasing overall yield.

It should be understood that the inventions described herein are provided by way of example only and that numerous changes, alterations, modifications, and substitutions may be made without departing from the spirit and scope of the inventions as delineated within the following claims.

What is claimed is:

1. A system for testing embedded memories on a chip, the system comprising:
    a plurality of embedded memories that are grouped into one or more virtual memory blocks, each of the embedded memories including a plurality of memory cells, which are each assigned an associated address within the one or more virtual memory blocks;
    a test controller that is adapted to be coupled to the plurality of embedded memories, to communicate test data to the memory cells that are associated with assigned addresses, and to read data from the memory cells; and
    at least one compare circuit for comparing the data read from the memory cells to expected data, in order to determine if each of the memory cells is operating properly.

2. The system of claim 1, wherein the one or more virtual memory blocks comprise a plurality of unimplemented addresses, and wherein the system further comprises:
    mask logic that is communicatively coupled to the at least one compare circuit and to the test controller, and that is adapted to return a pass result to the test controller if an unimplemented address is tested in any of the plurality of embedded memories.

3. The system of claim 2 further comprising:
    a test data input port that is coupled to the plurality of embedded memories and that is adapted to receive test data from the test controller and to communicate the test data to the plurality of embedded memories;
    a test address input port that is coupled to the plurality of embedded memories and that is adapted to receive test addresses corresponding to the test data from the test controller and to communicate the test addresses to the plurality of embedded memories; and
    a test data output port that is coupled to the mask logic and that is adapted to receive compare results from the mask logic and to communicate the results to the test controller.

4. The system of claim 3 further comprising:
    a first plurality of multiplexers which are each coupled to a unique of the plurality of embedded memories and which are adapted to selectively communicate test data to the plurality of embedded memories when the system is operating in a test mode, and normal data to the plurality of embedded memories when the system is operating in a normal mode.

5. The system of claim 4 further comprising:
    a second plurality of multiplexers which are each coupled to a unique one of the plurality of embedded memories and which are adapted to communicate test addresses to the plurality of embedded memories when the system is operating in a test mode, and normal addresses to the plurality of embedded memories when the system is operating in a normal mode.

6. The system of claim 5 further comprising:
    test mode circuitry which is coupled to the first and second plurality of multiplexers and which is adapted to communicate control signals to the first and second plurality of multiplexers, effective to cause the first and second plurality of multiplexers to selectively communicate test data and addresses and normal data and addresses to and from the plurality of embedded memories.

7. The system of claim 1 wherein the plurality of embedded memories are grouped into the one or more virtual memory blocks based at least in part on a density of each embedded memory.

8. The system of claim 1 wherein the plurality of embedded memories are grouped into the one or more virtual memory blocks based at least in part on a configuration of each embedded memory.

9. The system of claim 1 wherein the plurality of embedded memories are grouped into the one or more virtual memory blocks based at least in part on a data bus width of each embedded memory.

10. A method for testing a plurality of memory modules embedded on a chip, comprising the steps of:
    defining an address space of the chip to cover the plurality of memory modules combined; and
    testing the plurality of memory modules as a single virtual memory block.

11. The method of claim 10 further comprising the step of:
    arranging the plurality of memory modules to form the virtual memory block.

12. The method of claim 11 further comprising the step of:
    assigning addresses to the plurality of memory modules based on the location of the plurality of memory modules within the virtual memory block.

13. The method of claim 12 further comprising the step of:
    masking unimplemented addresses within the memory modules, effective to cause a positive result to be generated when the unimplemented addresses are tested.

14. The method of claim 12 wherein the memory modules are arranged based on one or more of the following attributes: density, configuration, and data bus width.

15. A method of testing a plurality of embedded memories on a chip, comprising the steps of:
    arranging the plurality of embedded memories into one or more virtual memory blocks;
    assigning addresses to cells of the embedded memories corresponding to the location of the embedded memories within the one or more virtual memory blocks; and
    testing each of addresses of the one or more virtual memory blocks in a predetermined sequence, effective to test each of the corresponding cells of the embedded memories.

16. The method of claim 15 further comprising the steps of:
    masking unimplemented addresses within the plurality of embedded memories; and
    generating a positive result when on of the unimplemented addresses is tested.

17. The method of claim 15 further comprising the step of:
    determining a number of virtual memory blocks for testing, based at least in part on the types of memory modules on a chip.

18. The method of claim 15 wherein the memory modules are arranged into the one or more virtual memory blocks based on one or more of the following attributes: density, configuration, and data bus width.

* * * * *